(12) United States Patent
Su

(10) Patent No.: US 6,819,832 B2
(45) Date of Patent: Nov. 16, 2004

(54) ARRANGEMENT FOR MONITORING THE EMISSION WAVELENGTH OF A LASER SOURCE

(75) Inventor: Daoning Su, Colchester (GB)

(73) Assignee: Agilent Technologies Inc., Palo Alto, CA (US)

( * ) Notice: Subject to any disclaimer, the term of this patent is extended or adjusted under 35 U.S.C. 154(b) by 158 days.

(21) Appl. No.: 10/348,282

(22) Filed: Jan. 21, 2003

(65) Prior Publication Data

US 2003/0142904 A1 Jul. 31, 2003

(30) Foreign Application Priority Data

Jan. 21, 2002 (EP) .............................................. 02250414

(51) Int. Cl.[7] .............................. G02B 6/32; G02B 6/42; H01S 5/0687
(52) U.S. Cl. ........................ 385/33; 385/48; 372/29.021
(58) Field of Search .............................. 372/29.021, 31, 372/32, 29.02; 385/33–35, 48, 88

(56) References Cited

U.S. PATENT DOCUMENTS

| 4,309,671 A | 1/1982 | Malyon ...................... 331/94.5 |
| 6,144,025 A | 11/2000 | Tei et al. ..................... 250/226 |
| 6,704,334 B2 * | 3/2004 | Yokoyama ............... 372/29.02 |
| 6,711,188 B2 * | 3/2004 | Ito et al. ....................... 372/32 |

FOREIGN PATENT DOCUMENTS

| EP | 0881633 A2 | 12/1998 |
| EP | 0967698 A2 | 12/1999 |

OTHER PUBLICATIONS

Patent Abstracts of Japan publication No. 55126208.
Patent Abstracts of Japan publication No. 03091283.
Patent Abstracts of Japan publication No. 03286574.
Patent Abstracts of Japan publication No. 62058689.

* cited by examiner

Primary Examiner—Akm Enayet Ullah
Assistant Examiner—Jerry T. Rahll

(57) ABSTRACT

An arrangement for monitoring the emission wavelength of a laser source emitting a main radiation beam to be launched into an optical waveguide includes a wavelength selective photosensitive element adapted to be exposed to the radiation beam to generate an output signal indicative of the wavelength of the radiation. The arrangement comprises an optical system defining a beam propagation path for the radiation beam towards the waveguide. The wavelength selective photosensitive element is arranged at a marginal position of the beam, to collect at least a corresponding marginal portion of the radiation beam, whereby the signal indicative of the wavelength of the radiation is generated from said marginal portion of the radiation beam in the optical system.

12 Claims, 1 Drawing Sheet

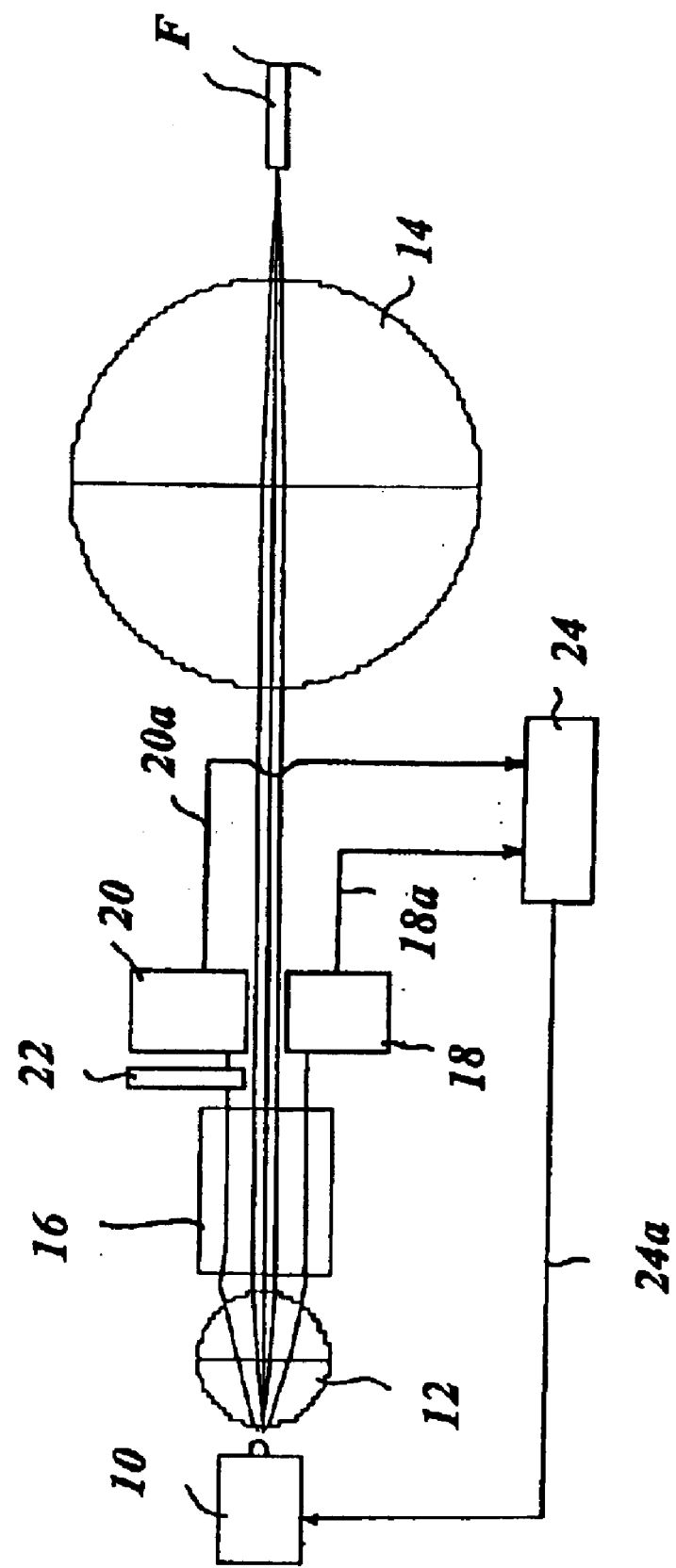

ARRANGEMENT FOR MONITORING THE EMISSION WAVELENGTH OF A LASER SOURCE

The invention relates to arrangements for monitoring the emission wavelength of laser sources.

Commercial WDM (Wavelength Division Multiplex) transmission systems, such as "dense" WDM (DWDM) systems provide high transmission capacity by using reduced channel spacing (e.g. 100–50 GHz). Real time wavelength monitoring and control is thus necessary in order to ensure the wavelength stability required for the optical sources used in such systems.

A number of devices adapted for that purpose are based on the arrangement currently referred to as "wavelength locker". This usually consists of two photodiodes sampling two portions of the laser beam. Specifically, one of the diodes, used as a reference, samples an unfiltered portion of the laser beam. Another portion of the laser beam is passed through an optical filter and caused to impinge onto the second photodiode. The response (i.e. the photocurrent) of the second diode is thus a function of the possible displacement of the actual wavelength of beam generated by the laser source with respect to the wavelength of the filter and can thus be used as a signal to stabilise the emission wavelength of the laser source.

Various arrangements are known in order to effect stabilisation. For instance, in the case of diode lasers a Peltier element can be used as a stabilising element by controlling the temperature of the laser diode.

A beam splitter is used to split the laser beam into a main beam to be used for the intended application (e.g. for launching into a fiber) and one or more secondary beam or beams to be directed towards the photodiodes of the wavelength locker arrangement. An optical filter or etalon can be used with one of the photodiodes.

Exemplary of such prior art arrangements are U.S. Pat. No. 4,309,671 and U.S. Pat. No. 6,144,025.

In European patent application No. 01 3 04 026.6, included in the prior art under the provisions of Art. 54(3) EPC, an arrangement is disclosed wherein the radiation lobe emitted from the back facet of a laser is directed partly—usually by means of direct propagation in air—toward a first photodiode used as a reference and partly—through a semiconductor slice acting as a collimating member and a wavelength-sensitive interference filter—toward a second photodiode to generate a control signal to stabilize the laser wavelength.

The possibility is also contemplated of exploiting optical radiation derived from the main radiation beam emitted from the first facet of the laser source: this is again done by splitting the necessary radiation out of the main radiation beam by means of a beam splitter.

Consequently, a reduction in the "useful" or usable power has been heretofore considered as inevitable in all wavelength locker arrangements intended to operate on the main laser beam generated by a laser source.

The main object of the present invention is thus to provide an arrangement for monitoring the emission wavelength of a laser source giving rise to a smaller reduction in terms of usable power, while including fewer components and providing improved thermal-mechanical stability.

According to the present invention, that object is achieved by means of an arrangement having the features called for in the claims which follow.

The present invention is based i.a. on recognising that those arrangements where the (main) beam of the laser source is launched into an optical fiber with a very small core size, such as a single mode fibre, a part of the power generated by the laser cannot be effectively launched into the fiber.

This phenomenon (i.e. at least some optical power being "wasted" or "lost" during launching into the fiber) is primarily due to two different factors, namely aberration in the optical system and laser beam quality and is particularly evident in the case of laser diode sources.

Due to the small spot size of laser diodes, beam launching optics for use with such radiation sources normally require large numerical aperture (NA) component. Glass spherical (ball) lenses are a popular choice for that purpose due to their large NA and low cost. Their inherent drawback is large beam aberration, particularly near the marginal part (edge) of the beam.

Due to the nature of mode matching in launching a beam into a single mode fibre, the marginal part of the beam, that is subject to aberration, contributes much less than the otherwise un-aberrated beam.

Also, the spatial distribution of the optical power generated by a laser diode may deviate from a Gaussian beam, which is regarded as the ideal beam profile for launching into a single mode fibre. The spatial distribution in question may in fact correspond to a Gaussian beam having superposed a certain amount of higher order beams. In comparison with a truly Gaussian beam, any such higher order beam exhibits a higher power level near the edge of the beam and contributes much less to coupling into the fiber.

A large proportion of the power eventually not launched into the fiber is often in the marginal portion of the beam at certain positions of the beam path, e.g. after the first lens in the optical system provided for launching the optical radiation into the fiber. The amount of power lost can be as high as 20–40% (and even higher) of the total power depending on optical design and laser source characteristics.

Also, in some cases, in order to achieve the desired bandwidth, the laser diode is driven at a current higher than required in terms of power requirement for launching into the fiber. Power must be taken out through either spatial filtering (i.e. cut off the marginal part of the beam) or by "detuning" the fibre launching arrangement.

The present invention is thus based on the recognition of the possibility of exploiting—in order to generate the sample beam used for stabilisation purposes—that marginal part of the main beam generated by the laser source that would not be properly used for launching into the fiber.

The basic advantages offered by the invention are related to the possibility of dispensing with the beam splitter provided in current wavelength locker arrangements, with the ensuing reduction of the number of components in the arrangement.

Also, the power available for detection and monitoring the emission wavelength is potentially higher for the same fibre coupling efficiency penalty and easier to control through the positioning of detectors in comparison to an optical configuration with a beam splitter that requires a new beam splitter of different reflectivity.

The beam splitter being dispensed with, the optical path from the laser source to the detector can be reduced. A reduction in the optical path length and the number of components is thus achieved that improves the thermal-mechanical stability of the wavelength dependent signal.

The invention will now be described, by way of example only, with reference to the annexed FIGURE of drawing showing a general layout of a wavelength locker arrangement according to the invention.

In the drawing, a laser source 10 such as a semiconductor diode laser is shown together with a first lens 12 and a second lens 14.

Lenses 12 and 14 jointly define an optical system for launching the radiation generated by laser 10 into an optical waveguide F. Typically, waveguide F is a monomode optical fiber for optical communications, that is an optical fiber with very small core size.

Also typically, lens 12 (that is located "upstream" of lens 14 in the optical system) is a spherical lens, e.g. a 1 mm diameter glass ball lens, whilst lens 14 (that is located "downstream" of lens 12 in the optical system) is again a spherical lens with a larger focal length, e.g. 2.5 mm diameter ball lens.

The shape and size values indicated are purely exemplary in nature. Lenses 12 and 14 could be of the same material as indicated above or different materials. They can be of simple spherical optics, or compound, aspherical, diffractive or reflective nature.

As used herein, the word "lens" must therefore be understood in its widest meaning. For example, lens 12 may combine beam focusing and beam splitting capabilities through refractive or diffractive means to alter the beam.

Similarly, "marginal", as used herein in connection with the laser beam propagated between laser source 10 and optical waveguide F must also be understood in its widest sense, e.g. as referring in a general manner to a marginal part of the beam, a marginal position relative to the main beam, near the edge of the beam and so on.

Those of skill in the art will promptly appreciate that, for example, when a good single mode laser diode is used with an aspherical lens, it might not be desirable to block a large portion of the marginal part of the main beam for use in monitoring the emission wavelength of laser source 10. In this case, a beam splitting function can be easily built into lens 12 such that some of the power is diverted to the marginal position of the main beam and utilized for detection purpose.

Finally, it will be appreciated that terms such as "optical", "light", "photosensitive", and the like are used herein with the meaning currently allotted to those terms in fiber and integrated optics, being thus intended to apply to radiation including, in addition to visible light, e.g. also infrared and ultraviolet radiation.

Reference 16 designates an optical isolator (such as an optical component of 0.6 mm per 0.6 mm size) for preventing back reflection of radiation from the devices located downstream of isolator 16 towards laser source 10.

References 18 and 20 designate two photodiodes intended to play the roles of the first and the second photodiode, respectively, in a typical wavelength locker arrangement.

Photodiode 18 is intended to be used as the reference photodiode, i.e. to be impinged upon by an unfiltered portion of the laser beam generated by source 10.

Photodiode 20 has associated therewith an optical filter 22, such as e.g. a narrow band pass filter, etalon having a wavelength-dependent transfer function, thus rendering photodiode 20 a wavelength selective photosensitive element that is exposed to another portion of the beam generated by laser source 10.

The photocurrents generated by photodiodes 18 and 20 are fed via respective lines 18a, 20a to a control unit 24 which in turn acts on laser source 10 via a control line 24a to perform wavelength stabilization of laser source 10.

Connection of photodiodes 18 and 20 (including filter 22) to unit 24 as well as operation of the circuit arrangement thus generated (wavelength stabilization via e.g. a Peltier element) are conventional in the art. As a consequence, characteristics and principles of operation of such an arrangement do not need to be described herein in detail, such characteristics and principles of operation not being per se relevant for the purpose of understanding the invention.

A significant feature of the invention is related to photodiode 18 and photodiode 20 (in the following filter 22 will in fact be regarded as included in photodiode 20, even though possibly comprised of separate component) being arranged along the propagation path from laser source 10 to fiber F.

More specifically, photodiodes 18 and 20 are positioned at a marginal position of the main beam such that they are exposed to respective marginal portions of the radiation generated by source 10 and propagated through lens 12.

Photodiode 20, 22—acting as a wavelength selective photosensitive element—is thus arranged at a marginal position of the beam propagation path to collect a corresponding marginal portion of the radiation beam propagated from laser source 10.

The output signal on line 20a, which is indicative of the wavelength of the radiation of laser source 10 is thus generated from said corresponding marginal portion of the radiation beam in the optical system including elements 12, 14, and 16.

Similarly, photodiode 18—intended to generate a reference signal indicative of the power of the radiation beam propagated from laser source 10—is arranged at the same—or another—marginal position of the beam propagation path through the optical system.

As a consequence of this, also the reference signal present on line 18a, that is indicative of the power of the radiation beam generated from laser source 10, is generated from said corresponding marginal portion of the radiation beam in the optical system comprising lenses 12, 14, and isolator 16 provided for launching the radiation from laser source 10 into fiber F.

In the exemplary embodiment shown therein, photodiodes 18 and 20 are both arranged downstream of lens 12 (and of isolator 16) and upstream of lens 14.

Other equivalent arrangements will be apparent to the skilled person on the basis of the teachings provided herein. This also applies to the relative positioning of photodiodes 18 and 20.

In the exemplary embodiment shown in the drawing, photodiodes 18 and 20 are standard photodiodes located diametrically opposed with respect to the propagation path of the optical beam from laser 10 to fiber F.

Alternative arrangements may include photodetectors 18 and 20 having light sensitive surfaces of a ring shape located concentrically with respect to the laser beam propagation path and only one of lenses 12 and 14 has optical power.

The possibility will also exist of dispensing with reference photodiode 18, whose presence—even though constituting a preferred feature—is not mandatory for carrying out the invention. This equally applies to isolator 16.

The portion of optical beam being "lost" (i.e. not properly launched into waveguide F) is generally higher in the case of an optical system with high aberration with respect to other arrangements, such as e.g. an arrangement where a very good single mode laser 10 is used with a properly designed aspherical lens 12 the amount of beam lost will be per se relatively low.

Positioning detector 20 (and detector 18) at marginal positions of the beam as shown in the drawing, will in any case yield advantageous results, including fewer optical components being required (with a favourable impact on the assembly process) and potentially shorter optical path (which leads to improved thermal-mechanical properties).

As indicated, lenses 12 and/or 14 may include optical systems different from spherical lenses such as diffractive components. A beam splitting function may be built into any of these lenses so that more power can be included in the marginal part (edge) of the beam. For instance lens 12 can produce three beams, one main beam for launching, and two other beams to impinge onto detectors for detection. Similarly, only one of the lenses 12 and 14 may actually exist (having optical power), which can also be regarded as corresponding to the case of two lenses with one of the lenses having infinite radius.

The actual lens size is not per se critical as the functionality thereof will depend on the size as well as material. Also, the various components shown in the FIGURE were not drawn to scale in order to facilitate understanding of the invention.

It will thus be appreciated that, the principles of the invention remaining the same, the details of construction and the embodiments may widely vary with respect to what has been described and illustrated purely by way of example, without departing from the scope of the present invention as defined by the annexed claims.

What is claimed is:

1. An arrangement for monitoring the wavelength of a radiation beam emitted by a laser source, the arrangement comprising:
    a wavelength selective photosensitive element adapted to be exposed to said radiation beam to generate an output signal indicative of the wavelength of said radiation; and
    an optical system for launching said radiation beam into an optical waveguide, said optical system defining a beam propagation path for said radiation beam towards said optical waveguide, wherein
    said wavelength selective photosensitive element is arranged at a marginal position of said beam propagation path to collect a corresponding marginal portion of said radiation beam, such that said output signal indicative of the wavelength of said radiation is generated from said corresponding marginal portion of said radiation beam in said optical system.

2. The arrangement of claim 1, wherein said optical system includes a first lens and a second lens cascaded along said beam propagation path and said wavelength selective photosensitive element is arranged at a location between said first lens and said second lens.

3. The arrangement of claim 1, further comprising a further photosensitive element for generating a reference signal indicative of the power of said radiation beam, wherein said further photosensitive element is arranged at said marginal position of said beam path such that said further signal indicative of the power of said radiation beam is generated from said corresponding marginal portion of said radiation beam in said optical system.

4. The arrangement according to claim 3, wherein said optical system includes a first lens and a second lens cascaded along said beam propagation path and said further photosensitive element is arranged at a location between said first lens and said second lens.

5. The arrangement of claim 4, wherein said optical system includes an optical isolator interposed in said beam propagation path.

6. The arrangement of claim 5, wherein said wavelength selective photosensitive element is arranged downstream of said optical isolator along said beam propagation path.

7. The arrangement of claim 5, wherein said optical isolator is arranged between said first lens and said second lens.

8. The arrangement of claim 7, wherein said further photosensitive element is located downstream of said optical isolator along said beam propagation path.

9. The arrangement of claim 1, wherein said wavelength selective photosensitive element includes a photodiode having associated therewith a wavelength selective optical filter.

10. The arrangement of claim 1, wherein said optical system includes at least one lens having at least one of a refractive, reflective and diffractive nature.

11. The arrangement of claim 1, wherein said optical system comprises a first lens and a second lens, and said first lens has a smaller focal length than said second lens, said first lens being arranged upstream of said second lens along said beam propagation path.

12. The arrangement of claim 1, wherein said optical system comprises a first lens and a second lens, and at least one of said lenses has optical power.

* * * * *